(12) United States Patent
Tomita

(10) Patent No.: US 7,038,549 B2
(45) Date of Patent: May 2, 2006

(54) OSCILLATOR CIRCUIT WITH SWITCHABLE FEEDBACK

(75) Inventor: Takashi Tomita, Tokyo (JP)

(73) Assignee: Oki Electric Industry Co., Ltd., (JP)

( * ) Notice: Subject to any disclaimer, the term of this patent is extended or adjusted under 35 U.S.C. 154(b) by 36 days.

(21) Appl. No.: 10/849,384

(22) Filed: May 20, 2004

(65) Prior Publication Data
US 2005/0093635 A1    May 5, 2005

(30) Foreign Application Priority Data
Oct. 30, 2003    (JP) ............... 2003-370020

(51) Int. Cl.
H03B 5/36    (2006.01)
H03B 5/02    (2006.01)
H03B 5/00    (2006.01)

(52) U.S. Cl. ............... 331/44; 331/116 FE; 331/158; 331/175

(58) Field of Classification Search ............... 331/44, 331/108 D, 116 R, 116 FE, 117 R, 117 FE, 331/158–159, 175
See application file for complete search history.

(56) References Cited

U.S. PATENT DOCUMENTS

| 4,704,587 A | * | 11/1987 | Ouyang et al. ........ 331/116 FE |
| 4,918,408 A | * | 4/1990 | Sakihama et al. ...... 331/116 R |
| 5,025,230 A | * | 6/1991 | Kondo et al. ........... 331/116 FE |
| 5,923,222 A | * | 7/1999 | Russell et al. .............. 331/185 |
| 5,982,246 A | * | 11/1999 | Hofhine et al. ........ 331/116 FE |

OTHER PUBLICATIONS

T. Inaba, *Hasshin Kairo no Sekkei to Oyo CQ*, 1993, p. 157, w/Explanation.

* cited by examiner

*Primary Examiner*—David Mis
(74) *Attorney, Agent, or Firm*—Nixon Peabody LLP; Donald R. Studebaker

(57) ABSTRACT

An oscillator circuit includes a pair of external terminals to which an external resonator is connected, an inverter connected between the external terminals, and an internal feedback path paralleling the inverter between the external terminals. An internal switching element enables the internal feedback path to be opened so that leakage current at the external terminal connected to the input end of the inverter can be measured accurately. Further internal switching elements are preferably provided so that the resistance of the internal feedback path can be switched. The internal feedback path may include one or more resistors, or the internal switching elements themselves may have sufficient on-resistance to function as resistors.

7 Claims, 5 Drawing Sheets

OSCILLATOR CIRCUIT WITH SWITCHABLE FEEDBACK

BACKGROUND OF THE INVENTION

1. Field of the Invention

The present invention relates to an oscillator circuit disposed in a semiconductor integrated circuit (referred to below as an IC or semiconductor IC), more particularly to an oscillator circuit that provides an oscillating signal with a predetermined frequency when connected to an external crystal resonator or ceramic resonator.

2. Description of the Related Art

A conventional oscillator circuit of the type described in, for example, *Hasshin Kairo no Sekkei to Oyo* (Design and Applications of Oscillator Circuits) by Inaba (published by CQ, page 157) is shown in FIG. 5. This oscillator circuit C0, which forms part of a semiconductor IC, comprises external terminals 1 and 2, an internal terminal OUT, an inverter I1, a buffer I2, and an internal feedback resistor Rfi. A resonator X (a crystal resonator or ceramic resonator), a damping resistor Rd, and a pair of capacitors Cg, Cd are connected to the external terminals 1, 2. Driven by the inverter I1, the resonator X oscillates at a predetermined frequency, generating an oscillating signal that is reshaped by the oscillating circuit into a square-wave digital pulse signal and sent from the internal terminal OUT to internal circuitry in the IC.

In the oscillator circuit C0 shown in FIG. 5, the internal feedback resistor Rfi provides a direct-current (DC) bias between external terminals 1 and 2. The resistance value of the feedback resistor is a constant that determines the cutoff frequency of the oscillator circuit; as the resistance value is increased, the cutoff frequency becomes lower, enabling the oscillator circuit to oscillate down to a lower frequency. Increasing the resistance value, however, makes the oscillator circuit more susceptible to the effect of current leakage at external terminal 1. If the DC bias varies due to the leakage current, the circuit may oscillate unstably and in the worst case may even fail to oscillate at all. The resistance value of the feedback resistor is therefore preferably optimized according to the required oscillation frequency and the effect of leakage current.

A problem that arises in the above-described conventional oscillator circuit is that it is impossible to measure the small leakage current flowing into external terminal 1 after fabrication because external terminal 1 is connected through the feedback resistor to the output terminal of the inverter I1. Another problem is that the resistance value of the internal feedback resistor Rfi cannot be changed after fabrication.

The present invention addresses these problems, with the object of providing an oscillator circuit that permits leakage current to be measured and the internal resistance value to be changed according to, for example, the measured value of the leakage current.

SUMMARY OF THE INVENTION

The invented oscillator circuit has a pair of external terminals to which an external resonator is connected, an inverter connected internally between the pair of external terminals, and an internal feedback path paralleling the inverter between the pair of external terminals. The feedback path includes a switching element by which the feedback path can be opened. The switching element is switched on and off by a control signal. The feedback path may also include an internal resistor connected in series with the switching element. Alternatively, the switching element may have a predetermined on-resistance and function as a resistor in the on-state.

When the switching element is switched off, leakage current at the external terminal connected to the input of the inverter can be measured accurately, so that the manufacturer can screen out circuits with excessive leakage current.

The feedback path preferably includes a plurality of switchable resistance elements, which can be switched to vary the internal resistance of the oscillator circuit. Each switchable resistance element may comprise, for example, a resistor and a switch, or a switch with a predetermined on-resistance. The switching element mentioned above may function as one of the switchable resistance elements.

DETAILED DESCRIPTION OF THE INVENTION

Figure 1:
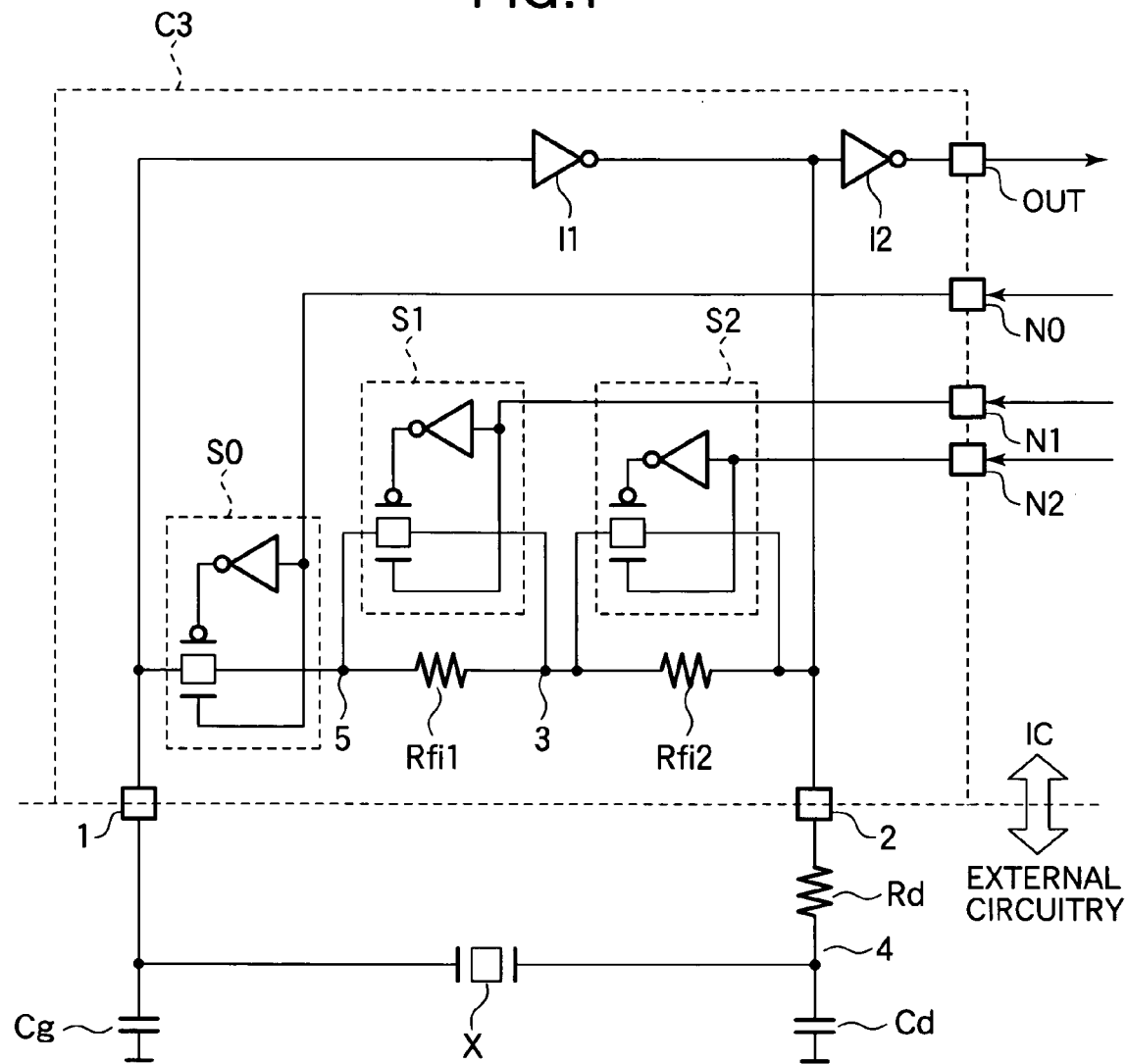
FIG. 1 is a circuit diagram showing an oscillator circuit according to a first embodiment of the invention.

Embodiments of the invention will now be described with reference to the attached drawings, in which like elements are indicated by like reference characters.

First Embodiment

Referring to FIG. 1, the first embodiment is an oscillator C3 embedded in a semiconductor IC. The oscillator circuit C3 comprises external terminals 1 and 2, internal nodes 3 and 5, an inverter I1 that drives a resonator X, a buffer I2 that sends an oscillating signal to internal circuitry in the IC, internal feedback resistors Rfi1 and Rfi2, switching elements S0, S1, and S2, and internal terminals OUT, N0, N1, and N2.

The input and output terminals of the inverter I1 are connected to external terminals 1 and 2, respectively. The input and output terminals of the buffer I2 are connected to external terminal 2 and internal terminal OUT, respectively. The output signal from the oscillator circuit C3 is sent to internal circuitry in the IC via internal terminal OUT.

Switching element S0 is connected between external terminal 1 and internal node 5, and provides an electrical path therebetween. The control signal terminal controlling the on/off-state of switching element S0 is connected to internal terminal N0, which receives a control signal from the internal circuitry in the IC.

Internal feedback resistor Rfi1 is connected between nodes 3 and 5; internal feedback resistor Rfi2 is connected between node 3 and external terminal 2.

Switching element S1 is connected between nodes 3 and 5, thus in parallel with internal feedback resistor Rfi1, and provides an electrical path between nodes 3 and 5. The control signal terminal controlling the on/off-state of switching element S1 is received from the internal circuitry at internal terminal N1.

Switching element S2 is connected between node 3 and external terminal 2, thus in parallel with internal feedback resistor Rfi2, and provides an electrical path between node 3 and external terminal 2. The control signal terminal controlling the on/off-state of switching element S2 is received from the internal circuitry at internal terminal N2.

The resonator X (a crystal resonator or ceramic resonator), a damping resistor Rd, and a pair of capacitors Cg, Cd are connected externally to the IC. The resonator X is connected between external terminal 1 and an external node 4, the damping resistor Rd between external terminal 2 and node 4, capacitor Cg between external terminal 1 and ground (denoted by a short line), and capacitor Cd between node 4 and ground.

Switching element S0 is switched on or off depending on the logic level of the control signal input to internal terminal N0. In the oscillator circuit C3 in FIG. 1, a logical one input to internal terminal N0 switches switching element S0 on and a logical zero input switches switching element S0 off. Switching element S0 can also be adapted to operate with the reverse of this input logic.

When switching element S0 is in the on-state (conducting), since a short circuit is formed between external terminal 1 and node 5, a current path between external terminals 1 and 2 is formed through the feedback resistors. When switching element S0 is in the off-state (not conducting), external terminal 1 is electrically isolated from node 5, and the path through the feedback resistors between external terminals 1 and 2 is not electrically conductive.

Figure 2:
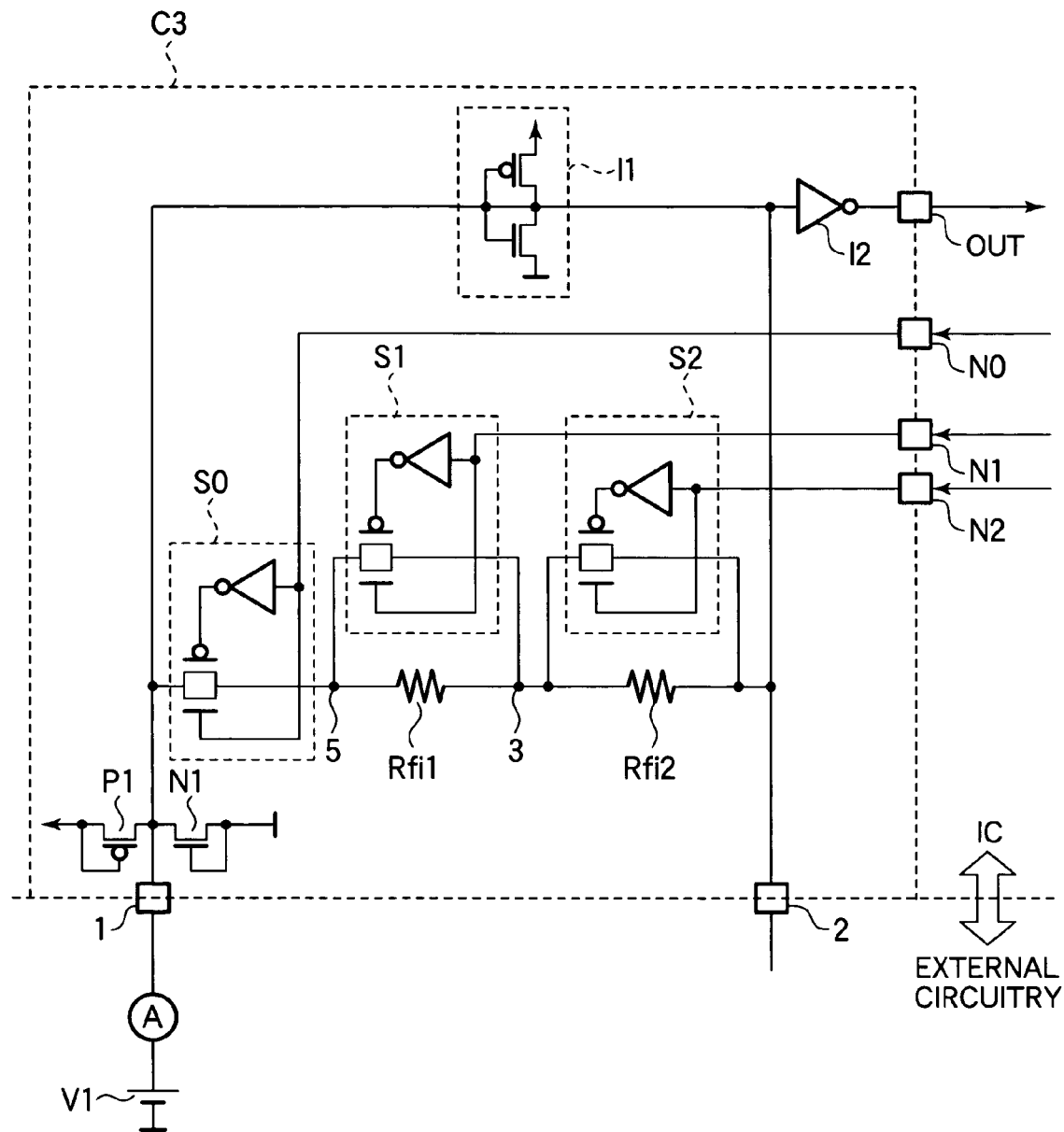
FIG. 2 shows a method for measuring leakage current flowing into an external terminal of the oscillator circuit in FIG. 1.

FIG. 2 illustrates how leakage current flowing into external terminal 1 of the oscillator circuit C3 can be measured in the first embodiment. In FIG. 2, the small leakage current flowing into external terminal 1 is measured by applying a DC voltage V1 to external terminal 1 while switching element S0 is switched off by the control signal provided from internal terminal N0 to electrically isolate the internal resistors from this terminal 1.

As shown in FIG. 2, an ESD (electrostatic discharge) protection circuit comprising a p-channel metal-oxide-semiconductor (PMOS) transistor P1 and an n-channel metal-oxide-semiconductor (NMOS) transistor N1 is connected to external terminal 1. The current measurement method in FIG. 2 enables the sum of the small leakage currents flowing through the protection circuit to be included.

To make the oscillator circuit C3 operate normally, switching element S0 is switched on (so that it conducts) and the path through the feedback resistors between external terminals 1 and 2 becomes electrically continuous. Under this condition, an electrical path from external terminal 1 to the output terminal of the inverter I1 is also formed through the feedback resistors, so it is impossible to measure the leakage current at external terminal 1 correctly because the larger output current conducted through the inverter I1 is also measured at the same time. Accordingly, the oscillator circuit C3 of the first embodiment is constructed so that external terminal 1 can be electrically isolated from the internal resistors by switching off switching element S0, thereby enabling the leakage current flowing into external terminal 1 to be measured correctly.

Switching element S1 is switched on or off depending on the logic level of the control signal input to internal terminal N1. In the oscillator circuit C3 in FIG. 1, a logical one input to internal terminal N1 switches switching element S1 on and a logical zero input switches switching element S1 off, but switching element S1 can also be adapted to operate with the reverse of this input logic.

Switching element S2 is switched on or off depending on the logic level of the control signal input to internal terminal N2. In the oscillator circuit C3 in FIG. 1, a logical one input to internal terminal N2 switches switching element S2 on and a logical zero input switches switching element S2 off, but switching element S2 can also be adapted to operate in the same manner with the reverse input logic.

When switching element S1 is in the on-state (conducting), internal feedback resistor Rfi1 is short-circuited. Similarly, when switching element S2 is in the on-state (conducting), internal feedback resistor Rfi2 is short-circuited. Accordingly, the total feedback resistance value can be changed depending on the control signals input to internal terminals N1 and N2. For example, if the internal feedback resistors Rfi1 and Rfi2 have values of 1.6 megohms (MΩ) and 0.4 MΩ, respectively, then the total resistance provided by feedback resistors Rfi1 and Rfi2 varies depending on the combination of the logical values ('0' and '1') at internal terminals N1 and N2 as follows:

when N1='0' and N2='0', the total feedback resistance is 2.0 MΩ;

when N1='0' and N2='1', the total feedback resistance is 1.6 MΩ;

when N1='1' and N2='0', the total feedback resistance is 0.4 MΩ.

Figure 3:
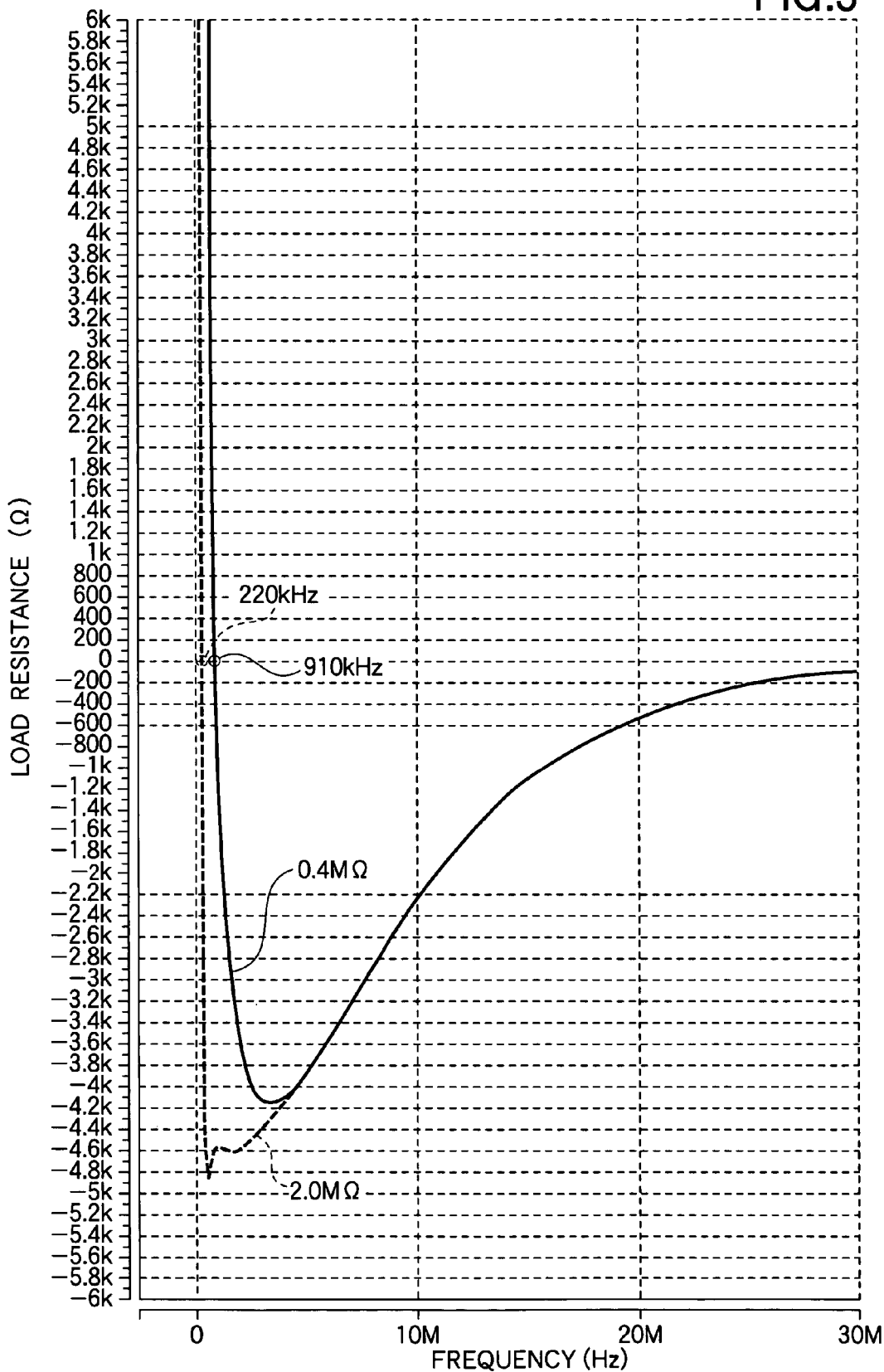
FIG. 3 shows simulation results of negative resistance versus operating frequency of the oscillator circuit in FIG. 1.

FIG. 3 shows simulation results of the negative resistance of the oscillator circuit C3 in the first embodiment as a function of its operating frequency. The negative resistance characteristic of an oscillator circuit varies depending on the power supplied from the oscillator circuit to the crystal resonator. An oscillator circuit can oscillate at frequencies at which the negative resistance has a negative value, but cannot oscillate at frequencies at which the negative resistance has a positive value. The frequency at which the negative resistance has a zero value is referred to as the cutoff frequency. For purposes of comparison two cases, in which the total feedback resistance of the oscillator circuit C3 is 0.4 MΩ and 2.0 MΩ, are shown in FIG. 3.

As indicated in FIG. 3, the cutoff frequency is 910 kHz when the total feedback resistance value is 0.4 MΩ, and 220 kHz when the total feedback resistance value is 2.0 MΩ. It can be confirmed from these simulations that different negative resistance characteristics and accordingly a different cutoff frequency are obtained if the feedback resistance value is changed.

As described above, according to the first embodiment, since external terminal 1 can be electrically isolated from the internal resistors by switching off switching element S0, it is possible to measure leakage current flowing into external terminal 1 correctly. Defective circuits with excessive leakage current can thereby be screened out by pre-shipment tests. The leakage current at external terminal 1 is an important measurement, since this leakage current may adversely affect oscillation.

Further, according to the first embodiment, switching elements S1 and S2 enable the internal feedback resistor in the IC to be optimized by internal control signals. The optimum resistance value can thereby be selected according to the required oscillation frequency and the measured leakage current to obtain stable oscillation. For example, when fabrication variations produce a large leakage current and accordingly cause unstable oscillation, the effect of the leakage current can be reduced by changing the feedback resistance to a smaller value. Alternatively, when the feedback resistance has a larger value than the target value due to fabrication variations and accordingly the oscillation has become unstable, the effect of the leakage current can be reduced by changing the feedback resistance to a smaller value.

In the first embodiment, it is possible to eliminate either switching element S1 and internal terminal N1 or switching element S2 and internal terminal N2, or both of these. If both are eliminated, internal feedback resistors Rfi1 and Rfi2 can be merged into a single feedback resistor.

The switching elements S0, S1, S2 in the first embodiment have been described above as ideal switching elements having zero resistance, but they may have a significant non-zero resistance. In this case, the feedback resistance is obtained by combining the resistances of the internal resistors and the resistances of the switching elements.

The internal resistance in the first embodiment has one of three possible values. The number of possible values, however, can be increased by adding further switchable resistance units, each comprising an internal resistor and a switching element. The switchable resistance units may be connected in series or in parallel, or in a series-parallel combination as in the next embodiment.

Second Embodiment

A second embodiment will now be described with reference to FIG. 4, which is a circuit diagram showing an oscillator circuit C4. The oscillator circuit C4 is embedded in a semiconductor IC as in the first embodiment.

The oscillator circuit C4 of the second embodiment comprises external terminals 1 and 2, an internal node 3, internal terminals OUT, N1, N2, N3, and N4, an inverter I1, a buffer I2, and switching elements S1, S2, S3, and S4.

The oscillator circuit C4 of the second embodiment differs from the oscillator circuit C3 of the first embodiment in FIG. 1 in that switching element S3 and internal terminal N3 are provided in place of internal feedback resistor Rfi1, switching element S4 and internal terminal N4 are provided in place of internal feedback resistor Rfi2, and switching element S0 is not included.

Switching element S3 is connected between external terminal 1 and node 3, thus in parallel with switching element S1, and provides an electrical path between external terminal 1 and node 3. The control signal terminal controlling the on/off-state of switching element S3 is received from the internal circuitry in the IC at internal terminal N3. In combination, switching elements S1 and S3 function as a single switching element by which the feedback path between external terminals 1 and 2 can be opened (when both switching elements S1 and S3 are switched off).

Switching element S4 is connected between external terminal 2 and node 3, thus in parallel with switching element S2, and provides an electrical path between external terminal 2 and node 3. The control signal terminal controlling the on/off-state of switching element S4 is received from the internal circuitry in the IC at internal terminal N4. In combination, switching elements S2 and S4 may also function as a single switching element by which the feedback path between external terminals 1 and 2 can be opened (when both switching elements S2 and S4 are switched off).

Switching elements S1, S2, S3, and S4 are thus switched on and off by the control signals input to internal terminals N1, N2, N3, and N4, respectively. The switching elements S1, S2, S3, and S4 have predetermined on-resistances.

Next, the operation of the second embodiment will be described.

When at least one of switching elements S1 or S3 and at least one of switching elements S2 or S4 are switched on, the resistance of the feedback path between external terminals 1 and 2 depends on the combination of the switching elements that are in the on-state. If switching elements S1 to S4 all have the same on-resistance, three different internal feedback resistance values can be obtained. If switching elements S1 to S4 have different on-resistance values, up to nine different internal feedback resistance values can be obtained When both switching elements S1 and S3 or both switching elements S2 and S4 are switched off, external terminal 1 is electrically isolated from the output terminal of inverter I1, enabling the leakage current at external terminal 1 to be measured accurately as in the first embodiment.

As described above, the internal feedback resistors of the first embodiment are replaced by switching elements with predetermined on-resistances in the second embodiment. The switching elements in the second embodiment can be switched on and off in desired combinations to switch the resistance of the feedback path between external terminals 1 and 2, or to open this feedback path so that the leakage current at external terminal 1 can be measured correctly.

One of the switching elements in the second embodiment, switching element S2, for example, may be eliminated. Alternatively, switching elements S2 and S4 may be eliminated, forming a short circuit between external terminal 2 and node 3. In these cases the resistance of the feedback path between external terminals 1 and 2 can still be switched by use of switching elements S1 and S3.

It is also possible to eliminate switching elements S2, S3, and S4, leaving only switching element S1, for example, although in this case the resistance of the feedback path between external terminals 1 and 2 cannot be varied.

Figure 4:
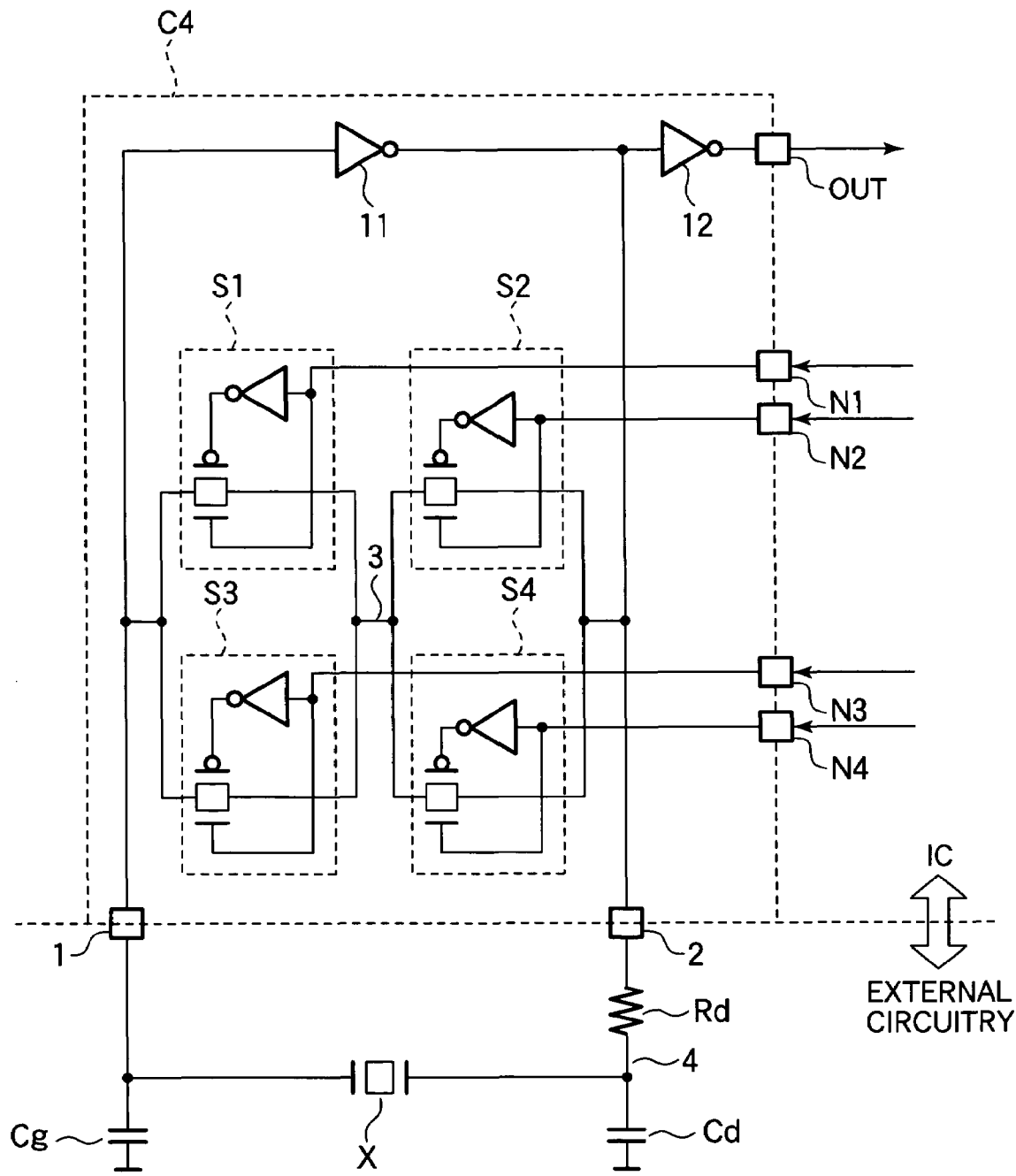
FIG. 4 is a circuit diagram showing an oscillator circuit according to a second embodiment of the invention.
Figure 5:
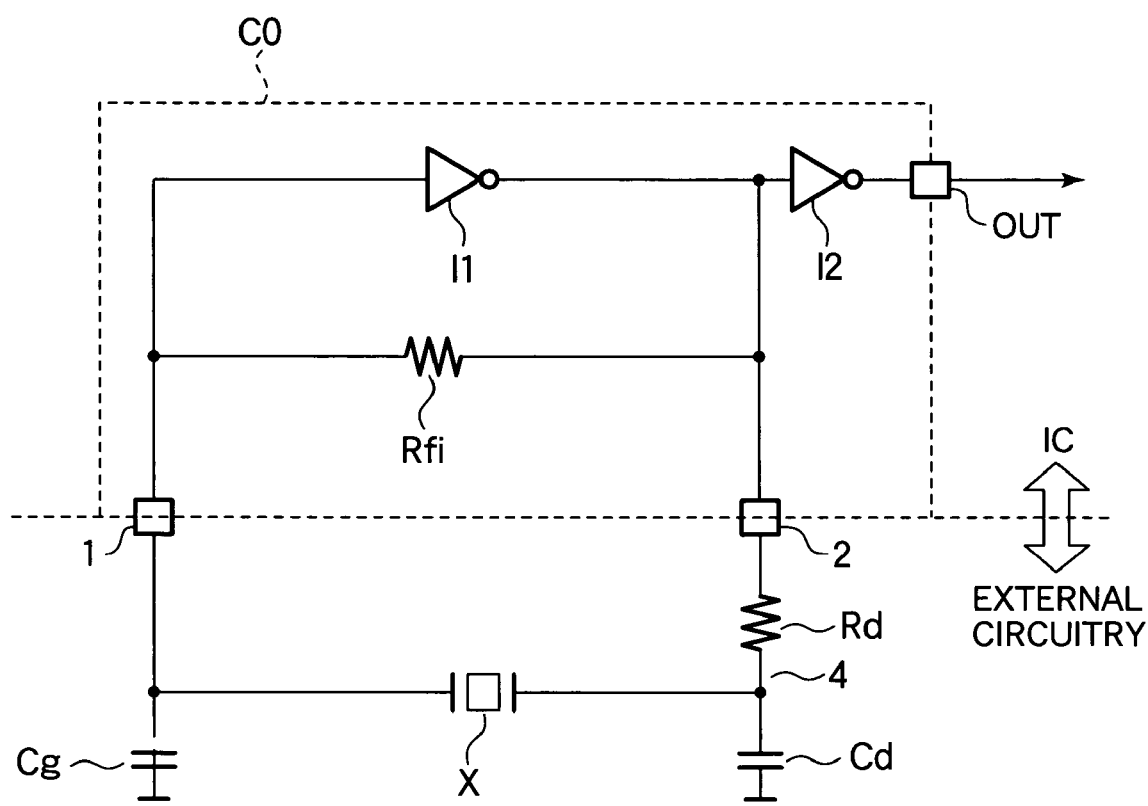
FIG. 5 is a circuit diagram showing a conventional oscillator circuit.

Alternatively, further switching elements can be added to the configuration in FIG. 4 to provide a larger selection of internal feedback resistance values.

Those skilled in the art will recognize that further variations are possible within the scope of the invention, which is defined in the appended claims.

What is claimed is:

1. An oscillator circuit for generating an oscillating signal with a predetermined frequency when connected to an external resonator, the oscillator circuit comprising:
   a pair of external terminals to which the external resonator is connected;
   an inverter connected between the pair of external terminals; and
   a feedback path between the pair of external terminals, the feedback path paralleling the inverter, the feedback path including a switching element by which the feedback path can be opened and closed and at least one switchable resistance element that can be switched to provide different amounts of resistance on the feedback path when the feedback path is closed, wherein the resistance can be optimized according to the predetermined frequency and to leakage current measured at one of the external terminals when the feedback path is opened.

2. The oscillator circuit of claim 1, wherein the switchable resistance element comprises a resistor and a switch.

3. The oscillator circuit of claim 1, wherein the switchable resistance element is a switch having a predetermined on-resistance.

4. The oscillator circuit of claim 1, wherein the switching element also functions as a switchable resistance element.

5. An oscillator circuit for generating an oscillating signal with a predetermined frequency when connected to an external resonator, the oscillator circuit comprising:
 first and second external terminals to which the external resonator is connected;
 an inverter connected between the first and second external terminals;
 a first switching element connected at one end to the first external terminal, the first switching element being switched on and off by a first control signal;
 a first internal resistor connected between another end of the first switching element and the second external terminal
 a second internal resistor connected in series with the first internal resistor between the first internal resistor and the second external terminal;
 a second switching element connected in parallel with the first internal resistor, the second switching element being switched on and off by a second control signal; and
 a third switching element connected in parallel with the second internal resistor, the third switching element being switched on and off by a third control signal.

6. An oscillator circuit for generating an oscillating signal with a predetermined frequency when connected to an external resonator, the oscillator circuit comprising:
 first and second external terminals to which the external resonator is connected;
 an inverter connected between the first and second external terminals;
 a first switching element connected in parallel with the inverter, the first switching element being switched on and off by a first control signal, the first switching element having a predetermined on-resistance;
 a second switching element connected in parallel with the first switching element, the second switching element being switched on and off by a second control signal, the second switching element having a predetermined on-resistance, the first and second switching elements also being connected in parallel between the first external terminal and an internal node; and
 a third switching element connected between the second external terminal and the internal node, the third switching element being switched on and off by a third control signal, the third switching element having a predetermined on-resistance.

7. The oscillator circuit of claim 6, further comprising a fourth switching element connected in parallel with the third switching element, the fourth switching element being switched on and off by a fourth control signal, the fourth switching element having a predetermined on-resistance.

* * * * *